US009761293B2

(12) United States Patent
Katayama

(10) Patent No.: US 9,761,293 B2
(45) Date of Patent: *Sep. 12, 2017

(54) SEMICONDUCTOR STORAGE DEVICE

(71) Applicant: KABUSHIKI KAISHA TOSHIBA, Minato-ku, Tokyo (JP)

(72) Inventor: Akira Katayama, Seoul (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/261,832

(22) Filed: Sep. 9, 2016

(65) Prior Publication Data

US 2017/0047103 A1 Feb. 16, 2017

Related U.S. Application Data

(63) Continuation of application No. PCT/JP2014/073111, filed on Aug. 27, 2014.

(60) Provisional application No. 61/951,929, filed on Mar. 12, 2014.

(51) Int. Cl.
*G11C 11/00* (2006.01)
*G11C 11/16* (2006.01)
*G11C 7/06* (2006.01)
*G11C 13/00* (2006.01)

(52) U.S. Cl.
CPC ........ *G11C 11/1673* (2013.01); *G11C 11/161* (2013.01); *G11C 11/1693* (2013.01); *G11C 13/004* (2013.01); *G11C 13/0061* (2013.01); *G11C 7/065* (2013.01); *G11C 13/0004* (2013.01); *G11C 13/0007* (2013.01); *G11C 2013/0054* (2013.01); *G11C 2213/79* (2013.01)

(58) Field of Classification Search
CPC .............. G11C 11/1673; G11C 11/161; G11C 11/1693

USPC ....... 365/46, 55, 74, 97, 100, 131, 148, 158, 365/171, 173, 163, 185.21, 189.011, 365/189.15, 189.09, 207, 210.1
See application file for complete search history.

(56) References Cited

U.S. PATENT DOCUMENTS

| 2004/0062074 | A1 | 4/2004 | Ooishi |
| 2014/0233294 | A1* | 8/2014 | Ting .......................... G11C 7/02 365/66 |
| 2014/0281189 | A1 | 9/2014 | Noguchi et al. |
| 2015/0243362 | A1* | 8/2015 | Nigam ..................... G11C 7/08 365/185.11 |
| 2016/0300621 | A1* | 10/2016 | Abe ..................... G11C 11/5628 |

FOREIGN PATENT DOCUMENTS

JP 2009064498 A 3/2009
JP 2014179150 A 9/2014

OTHER PUBLICATIONS

International Preliminary Report on Patentability and Written Opinion dated Sep. 22, 2016 issued in counterpart International Application No. PCT/JP2014/073111.
International Search Report (ISR) and Written Opinion dated Oct. 14, 2014 issued in International Application No. PCT/JP2014/073111.

* cited by examiner

*Primary Examiner* — Fernando Hidalgo
(74) *Attorney, Agent, or Firm* — Holtz, Holtz & Volek PC

(57) ABSTRACT

According to one embodiment, a semiconductor storage device includes a first semiconductor storage area; a second semiconductor storage area; a reference circuit; a sense amplifier senses data stored in the first semiconductor storage area and the second semiconductor storage area; and a control circuit.

17 Claims, 7 Drawing Sheets

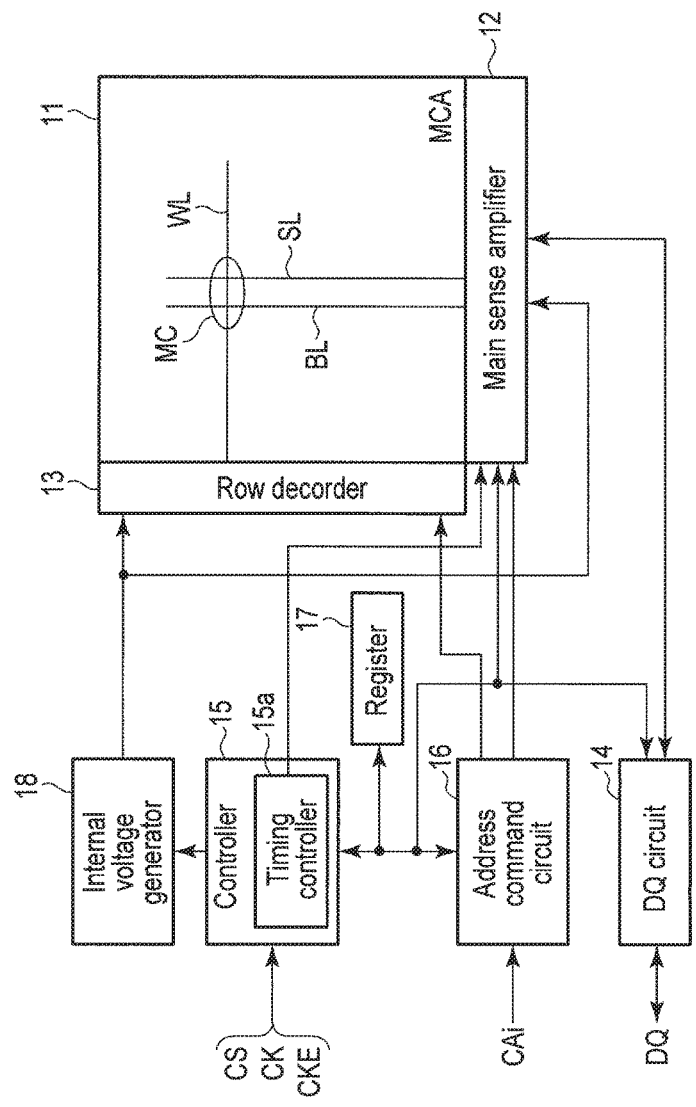
F I G. 1

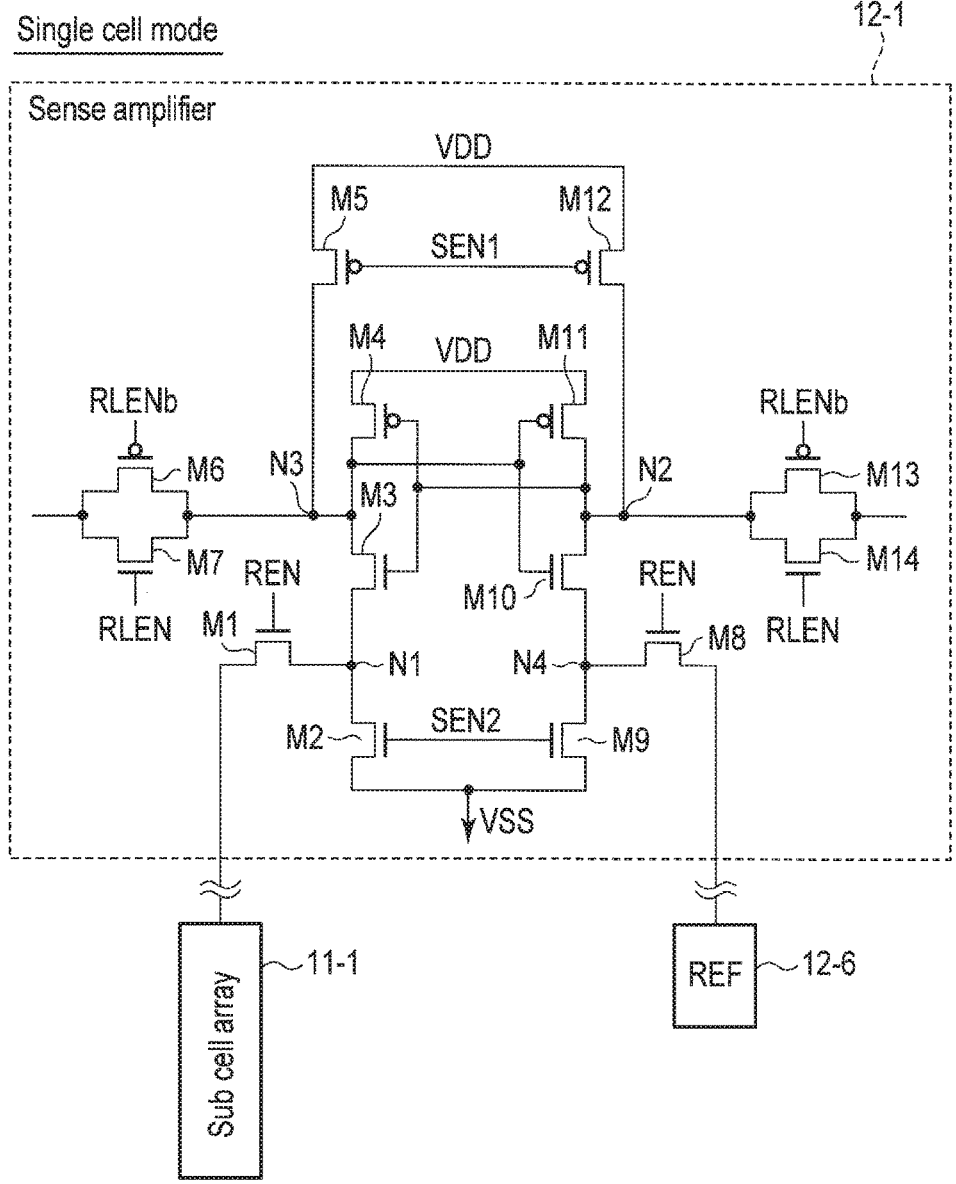
F I G. 5

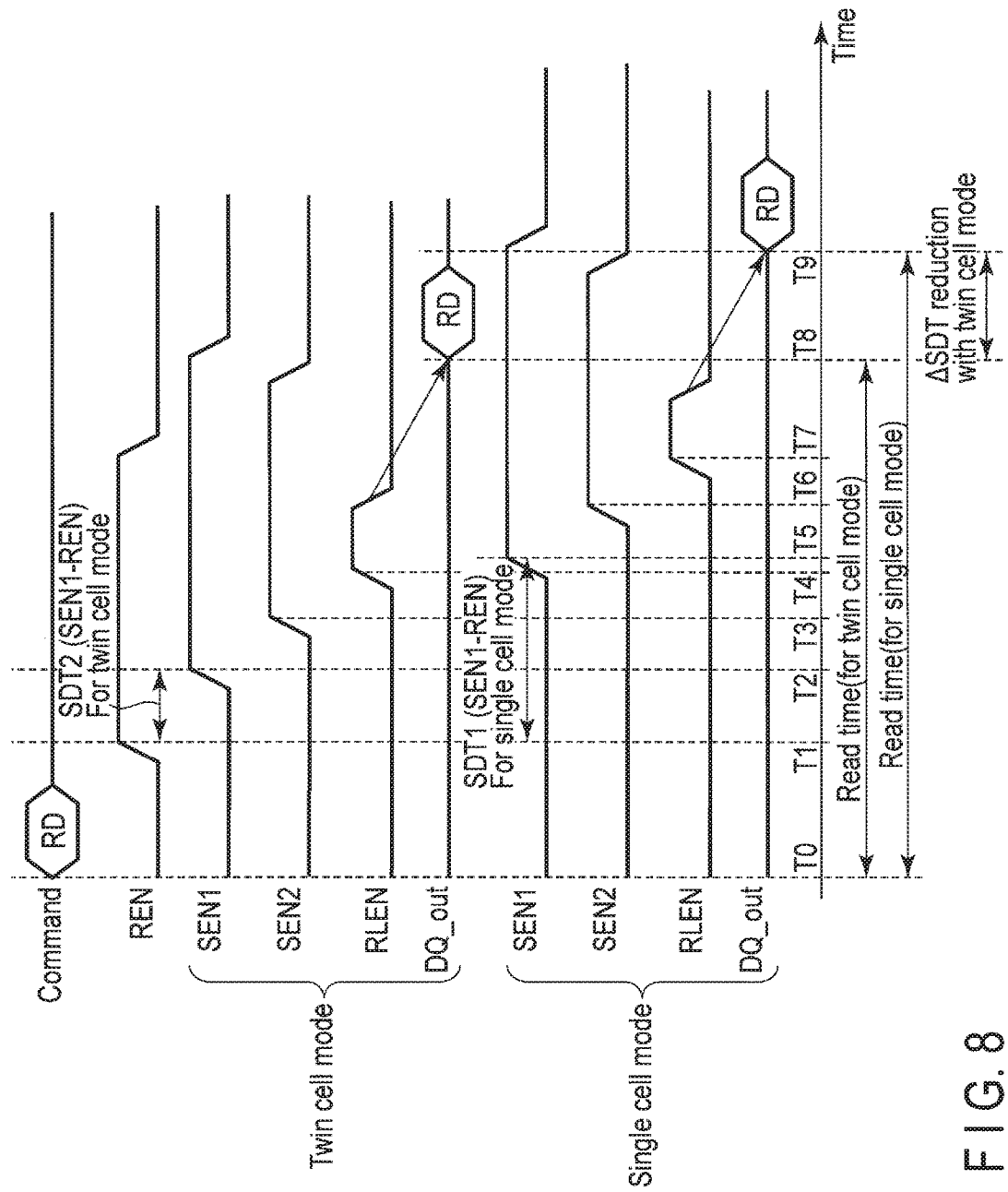
F I G. 8

SEMICONDUCTOR STORAGE DEVICE

CROSS-REFERENCE TO RELATED APPLICATIONS

This application is a Continuation Application of PCT Application No. PCT/JP2014/073111, filed Aug. 27, 2014, and based upon and claiming the benefit of U.S. Provisional Application No. 61/951,929, filed Mar. 12, 2014, the entire contents of which are incorporated herein by reference.

FIELD

Embodiments described herein relate generally to a semiconductor storage device.

BACKGROUND

There is known a magnetic random access memory (MRAM) as one of resistance change type memories. Writing methods of MRAMs include a magnetic field writing method and a spin transfer writing method. Of these methods, the spin transfer method is advantageous in increasing an integration density, reducing power consumption and enhancing capabilities, since this method has such a characteristic that a spin transfer current that is necessary for magnetization reversal decreases as the size of a magnetic body becomes smaller.

An MTJ (Magnetic Tunnel Junction) element of the spin transfer writing method has a multilayer structure which is composed of two ferromagnetic layers and a nonmagnetic barrier layer (insulation thin film) interposed therebetween, and digital data is stored by a change in magnetic resistance due to a spin polarization tunnel effect. The MTJ element may take a low resistance state and a high resistance state by a magnetization orientation of the two ferromagnetic layers. When the magnetization orientation (spin direction) of the two ferromagnetic layers is in a parallel state (P (Parallel) state), the MTJ element is in the low resistance state. When the magnetization orientation of the two ferromagnetic layers is in an antiparallel state (AP (AntiParallel) state), the MTJ element is in the high resistance state.

BRIEF DESCRIPTION OF THE DRAWINGS

FIG. 1 is a block diagram illustrating a structure of a semiconductor storage device according to an embodiment.

FIG. 5 shows a circuit illustrating a structure of the sense amplifier according to the embodiment.

FIG. 8 is a timing chart illustrating a read operation of the semiconductor storage device according to the embodiment.

DETAILED DESCRIPTION

Figure 2:
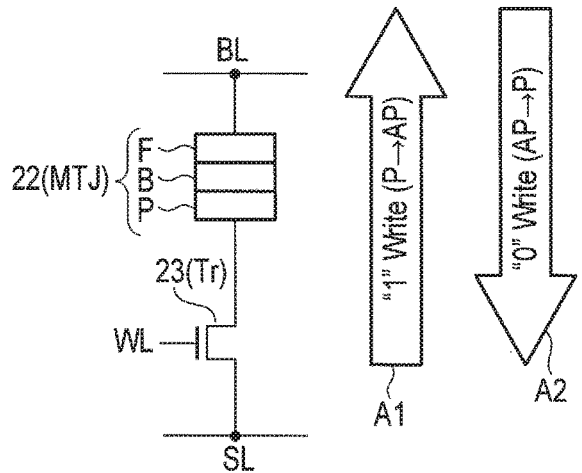
FIG. 2 is a view illustrating a write operation of a memory cell according to the embodiment.

In general, according to one embodiment, a semiconductor storage device includes a first semiconductor storage area configured to be able to store data; a second semiconductor storage area configured to be able to store data; a reference circuit; and a sense amplifier configured to sense data stored in the first semiconductor storage area and the second semiconductor storage area. The semiconductor storage device further includes a control circuit configured to control the sense amplifier; and a storage module configured to store first sense information relating to a first operation mode and second sense information relating to a second operation mode, and configured to supply the first sense information to the control circuit, when receiving a first operation mode selection signal which selects the first operation mode, or to supply the second sense information to the control circuit, when receiving a second operation mode selection signal which selects the second operation mode. The data stored in the first semiconductor storage area or the second semiconductor storage area is sensed in the first operation mode by using the reference circuit. The data stored in the first semiconductor storage area is sensed in the second operation mode by using the second semiconductor storage area. The control circuit is configured to supply a first control signal to the sense amplifier when the first operation mode selection signal and the first sense information are received, and to supply a second control signal to the sense amplifier when the second operation mode selection signal and the second sense information are received. The sense amplifier is configured to electrically connect the reference circuit and the first semiconductor storage area or the second semiconductor storage area, when receiving the first operation mode selection signal and the first control signal, and to execute a sense operation of sensing the data stored in the first semiconductor storage area or the second semiconductor storage area by using the reference circuit. The sense amplifier is configured to electrically connect the first semiconductor storage area and the second semiconductor storage area, when receiving the second operation mode selection signal and the second control signal, and to execute a sense operation of sensing the data stored in the first semiconductor storage area by using the second semiconductor storage area.

Hereinafter, embodiments, which have been constructed, will be described with reference to the accompanying drawings. In the description below, structural elements having substantially the same functions and structures are denoted by like reference signs, and an overlapping description is given only where necessary. The "alphabet" or "hyphen & numeral" after a numeral, which constitutes a reference sign, and the "numeral" or "hyphen & numeral" after a symbol, which constitutes a reference sign, are used in order to distinguish elements which are referred to by reference signs including the same numeral and have the same structure. When it is not necessary to distinguish elements which are indicated by reference signs including the same numeral, these elements are referred to by a reference sign including only a numeral or a symbol. For example, when it is not necessary to distinguish elements with reference signs 1a and 1b, these elements are comprehensively referred to by a reference sign 1. In addition, for example, when it is not necessary to distinguish elements with reference signs WL1 and WL2, these elements are comprehensively referred to by a reference sign WL.

It should be noted that the drawings are schematic ones, and the relationship between a thickness and a planar dimension, the ratio in thickness between layers, etc. are different from real ones. Thus, concrete thicknesses and dimensions should be judged in consideration of descriptions below. Needless to say, the drawings include parts with mutually different relations or ratios of dimensions. Besides, embodiments to be described below illustrate, by way of example, devices or methods for embodying technical concepts of the embodiments, and the technical concepts of the embodiments do not specifically restrict the material, shape, structure, arrangement, etc. of structural components to those described below. Various changes may be made in the technical concepts of the embodiments within the scope of the claims.

EMBODIMENTS

Structure of a Semiconductor Storage Device According to an Embodiment

To begin with, referring to FIG. 1, a basic structure of a semiconductor storage device according to an embodiment is schematically described. FIG. 1 is a block diagram illustrating a structure of the semiconductor storage device according to the embodiment.

A semiconductor storage device 1 according to the embodiment includes a memory cell array (also referred to simply as "cell array") 11, a main sense amplifier 12, a row decoder 13, a DQ circuit 14, a controller 15, an address command circuit 16, a register 17, and an internal voltage generator 18.

The memory cell array 11 is an MRAM, in which a plurality of memory cells MC are arranged two-dimensionally in a matrix. Each memory cell MC includes an MTJ 22 (not shown) and a cell transistor 23 (not shown). The MTJ element 22 is a magnetic tunnel junction element which stores data by a change in resistance state, and can rewrite data by an electric current. The cell transistor 23 is provided in association with the MTJ element 22, and is configured to be rendered conducive when a current is caused to flow in the associated MTJ element 22.

A plurality of word lines WL are arranged in a row direction and a plurality of bit lines BL are arranged in a column direction such that the word lines WL and bit lines BL cross each other. Two neighboring bit lines BL constitute a pair, and the memory cell MC is provided in association with an intersection between the word line WL and the bit line pair (in this embodiment, for convenience' sake, referred to as a bit line BL and a source line SL). The MTJ element 22 and cell transistor 23 of each memory cell MC are connected in series between the bit line pair (e.g. between BL and SL). In addition, the gate of the cell transistor 23 is connected to the word line WL.

The sense amplifier 12 is disposed in a bit line direction of the memory cell array 11, and recognizes, based on an external control signal, a command or an address by a command address signal CAi, and controls the bit line BL and source line SL.

In addition, the sense amplifier 12 is connected to the bit line BL, and reads out data stored in the memory cell by sensing a current flowing in the memory cell MC which is connected to the selected word line WL. Further, the sense amplifier 12 writes data by causing a current to flow in the memory cell MC which is connected to the selected word line WL.

Besides, when the sense amplifier 12 is receiving a twin/single selection signal, the sense amplifier 12 causes the memory cell array 11 to operate in a single cell mode or a twin cell mode. Incidentally, the single cell mode and twin cell mode will be described later.

The transmission/reception of data between the sense amplifier 12 and an external input/output terminal DQ is executed via the DQ circuit 14.

The row decoder 13 is disposed on each of both sides in the word line direction of the memory cell array 11, and decodes an address of the command address signal CAi which has been supplied from the address command circuit 16.

In addition, the row decoders 13 are disposed on both sides in the word line direction of the memory cell array 11 and connected to the word lines, and are configured to apply a voltage to the selected word line WL at a time of data read or data write. More specifically, the row decoder 13 is configured to be able to apply a voltage to the selected word line WL, in accordance with a decoded row address.

Various external control signals, for instance, a chip select signal CS, a clock signal CK and a clock enable signal CKE, are input to the controller 15. The controller 15 controls the address command circuit 16, and discriminates between an address and a command. In addition, the controller 15 includes a timing controller 15a.

The timing controller 15a controls, for example, a signal REN, a signal SEN1, a signal SEN2 and a signal RLEN which are supplied to the main sense amplifier 12, based on the twin/single selection signal and information (a sense period and a read latency to be described later) which is received from the register 17.

A command address signal CAi is input to the address command circuit 16. The address command circuit 16 transfers the command address signal CAi to the row decoder 13 and main sense amplifier 12.

The register 17 is a storage area for storing various settings which are used in the operation of the semiconductor storage device. In the present embodiment, the register 17 stores a sense period SDT1 which is needed for sense in a case of operating the memory cell array 11 in a single cell mode, a sense period SDT2 (SDT2<SDT1) which is needed for sense in a case of operating the memory cell array 11 in a twin cell mode, a read latency RL1 in a case of operating the memory cell array 11 in the single cell mode, and a read latency RL2 (RL2<RL1) in a case of operating the memory cell array 11 in the twin cell mode. In addition, when the register 17 is receiving a twin/single selection signal, the register 17 supplies the sense period and read latency to the timing controller 15a.

The internal voltage generator 18 is provided in order to generate an internal voltage (e.g. a voltage boosted by a power supply voltage) which is necessary for operations in the semiconductor storage device 1. This internal voltage generator 18, too, is controlled by the controller 15, and executes a boost operation and generates a necessary voltage.

<Write Operation of the Memory Cell MC>

Next, referring to FIG. 2, a write operation of the memory cell MC according to the embodiment is schematically described. FIG. 2 is a view illustrating the write operation of the memory cell MC according to the embodiment.

As illustrated in FIG. 2, one end of an MTJ element 22 of the memory cell MC according to the embodiment is connected to the bit line BL, and the other end of the MTJ element 22 is connected to one end of a current path of a cell transistor 23. The other end of the current path of the cell transistor 23 is connected to the source line SL. The MTJ element 22, which makes use of a TMR (tunneling magnetoresistive) effect, has a multilayer structure which is composed of two ferromagnetic layers F, P and a nonmagnetic layer (tunnel insulation film) B interposed therebetween, and stores digital data by a change in magnetic resistance by a spin polarization tunnel effect. The MTJ element 22 may take a low resistance state and a high resistance state by a magnetization orientation of the two ferromagnetic layers F, P. For example, if the low resistance state is defined as data "0" and the high resistance state is defined as data "1", 1 bit data can be stored in the MTJ element 22. Needless to say, the low resistance state may be defined as data "1" and the high resistance state may be defined as data "0".

For example, the MTJ element 22 is configured such that a fixed layer (pin layer) P, a tunnel barrier layer B and a recording layer (free layer) F are successively stacked. The pin layer P and free layer F are formed of a ferromagnetic material, and the tunnel barrier layer B is formed of an insulation film (e.g. $Al_2O_3$, MgO). The pin layer P is a layer with a fixed direction of magnetization orientation. The free layer F has a variable direction of magnetization orientation, and data is stored by the direction of magnetization.

If an electric current is caused to flow in a direction of arrow A1 at a time of write, the magnetization direction of the free layer F is set in an antiparallel state (AP state), relative to the magnetization direction of the pin layer P, and a high resistance state (data "1") is set. If an electric current is caused to flow in a direction of arrow A2 at a time of write, the magnetization directions of the pin layer P and free layer F are set in a parallel state (P state), and a low resistance state (data "0") is set. In this manner, in the MTJ element, different data can be written in accordance with the direction of flow of an electric current.

<Structure of the Cell Array and Main Sense Amplifier According to the Embodiment>

Figure 3:
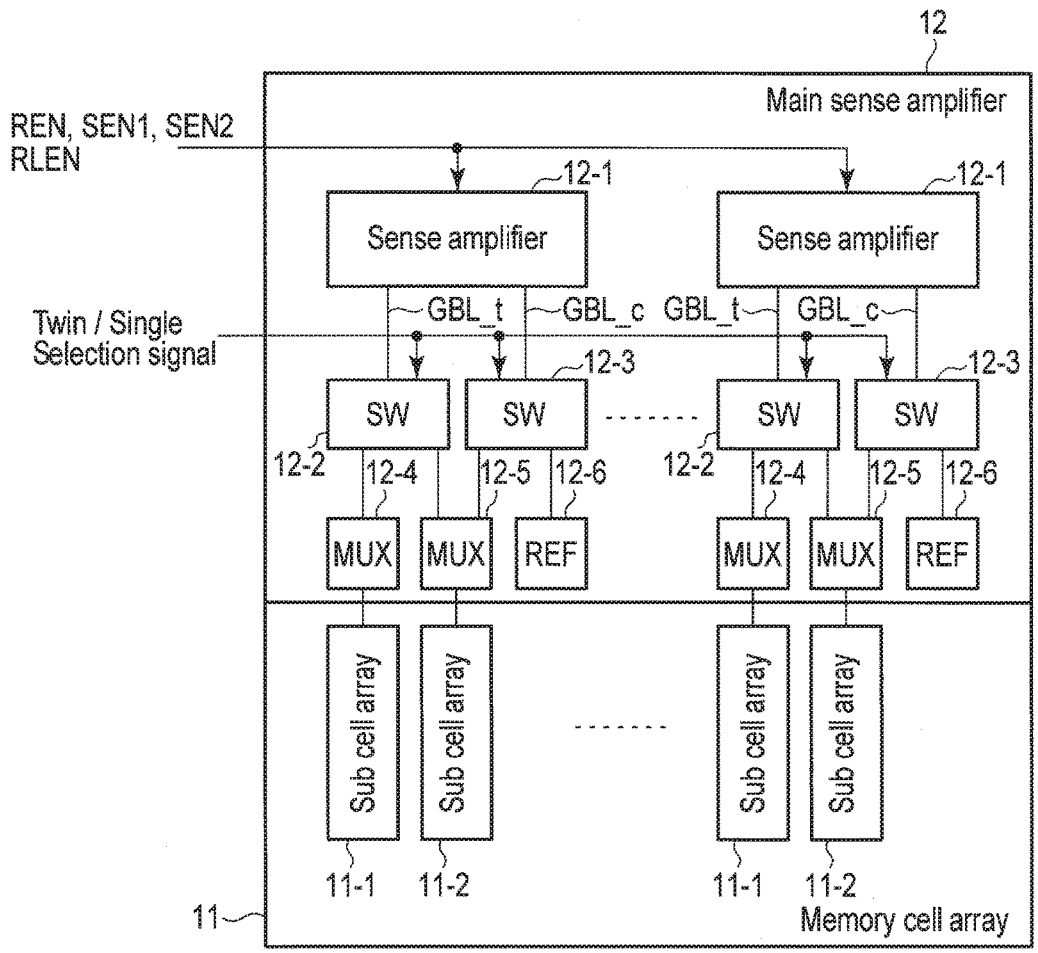
FIG. 3 is a block diagram illustrating a structure of a sense amplifier and a memory cell array according to the embodiment.

Next, referring to FIG. 3, a layout of the cell array and main sense amplifier according to the embodiment is schematically described.

As illustrated in FIG. 3, the main sense amplifier 12 includes a plurality of sense amplifiers 12-1. A first switch 12-2 is connected to each sense amplifier 12-1 via a global bit line GBL_t, and a second switch 12-3 is connected to each sense amplifier 12-1 via a global bit line GBL_s. In addition, a first multiplexer 12-4 and a second multiplexer 12-5 are connected to the first switch 12-2. Besides, the second multiplexer 12-5 and a reference circuit 12-6 are connected to the second switch 12-3.

The memory cell array 11 includes a plurality of first sub cell arrays 11-1 and second sub cell arrays 11-2. The plural first sub cell arrays 11-1 are connected to the first multiplexers 12-4, respectively. In addition, the plural second sub cell arrays 11-2 are connected to the second multiplexers 12-5, respectively.

When the sense amplifier 12 is receiving a twin/single selection signal from the controller 15, the first switches 12-2 and second switches 12-3 control the connection between the sense amplifiers 12-1, and the first sub cell arrays 11-1, second sub cell arrays 11-2 and reference circuits 12-6.

Specifically, when a "twin cell mode" is selected based on the twin/single selection signal, the first sub cell array 11-1 is connected to the sense amplifier 12-1 via the first multiplexer 12-4 and first switch 12-2, and the second sub cell array 11-2 is connected to the sense amplifier 12-1 via the second multiplexer 12-5 and second switch 12-3.

The twin cell mode is an operation mode in which sense of data is executed by using the sub cell array in place of the reference circuit 12-6. In the twin cell mode, complementary data are stored in the sub cell array 11-1 and sub cell array 11-2, respectively. To be more specific, when "1" data is stored at a predetermined address of the sub cell array 11-1, "0" data, which is complementary data of "1", is stored at an address of the sub cell array 11-2, which corresponds to this predetermined address. The sense amplifier 12-1 determines "0" data or "1" data, by sensing the complementary data of the sub cell array 11-1 and sub cell array 11-2.

In addition, when a "single cell mode" (to be described later) is selected based on the twin/single selection signal, the first sub cell array 11-1 is connected to the sense amplifier 12-1 via the first multiplexer 12-4 and first switch 12-2, and the reference circuit 12-6 is connected to the sense amplifier 12-1 via the second switch 12-3. Furthermore, when an "other single cell mode" is selected based on the twin/single selection signal, the second sub cell array 11-2 is connected to the sense amplifier 12-1 via the second multiplexer 12-5 and first switch 12-2, and the reference circuit 12-6 is connected to the sense amplifier 12-1 via the second switch 12-3.

The sense amplifier 12-1 operates, based on signals supplied from the timing controller 15a.

<Connection Example 1 of the Cell Array and Sense Amplifier According to the Embodiment>

Figure 4:
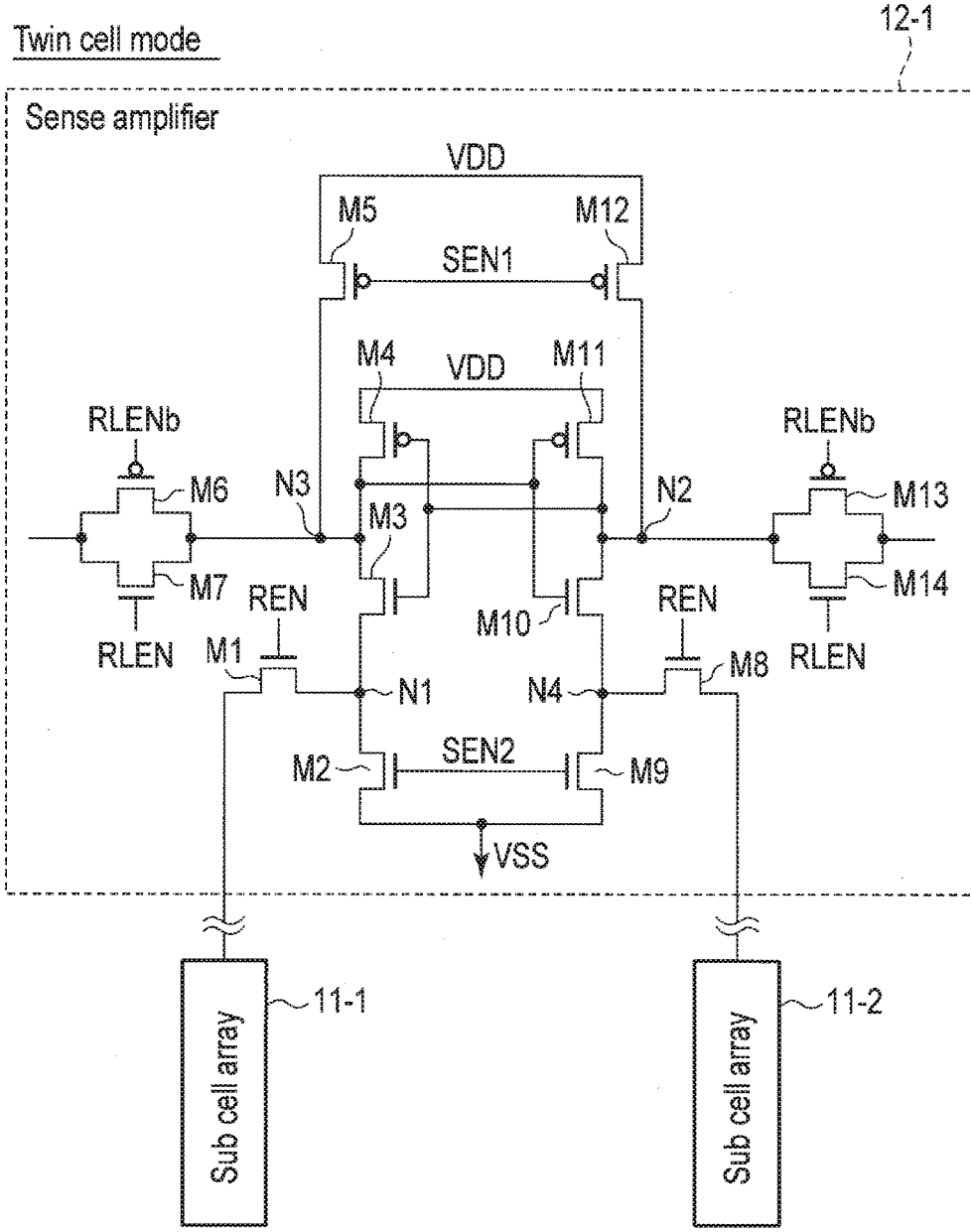
FIG. 4 shows a circuit illustrating a structure of the sense amplifier according to the embodiment.

Next, referring to FIG. 4, a description is given of a connection example of the cell array and sense amplifier in a case where the twin cell mode, in which data sense is executed by using the cell array in place of the reference circuit, is applied to the semiconductor storage device 1.

As illustrated in FIG. 4, the sense amplifier 12-1 includes NMOS transistors M1 to M3, M7, M8 to M10, and M14, and PMOS transistors M4 to M6, and M11 to M13.

In addition, the NMOS transistor M1 has a gate electrode to which a signal REN is input, has a current path with one end connected to the sub cell array 11-1 via the switch 12-2 and multiplexer 12-4 (not shown) and the other end connected to a node N1.

The NMOS transistor M2 has a gate electrode to which a signal SEN2 is input, and has a current path with one end connected to a ground potential VSS and the other end connected to the node N1.

Further, the NMOS transistor M3 has a gate electrode connected to a node N2, and a current path with one end connected to the node N1 and the other end connected to a node N3.

In addition, the PMOS transistor M4 has a gate electrode connected to the node N2, and a current path with one end connected to the node N3 and the other end to which a power supply voltage VDD is input.

The PMOS transistor M5 has a gate electrode to which a signal SEN1 is input, and has a current path with one end connected to the node N3 and the other end to which the power supply voltage VDD is input.

The PMOS transistor M6 has a gate electrode to which a signal RLENb is input, and has a current path with one end connected to the node N3.

The NMOS transistor M7 has a gate electrode to which a signal RLEN is input, and has a current path with one end connected to the node N3.

Besides, the NMOS transistor M8 has a gate electrode to which the signal REN is input, has a current path with one end connected to the sub cell array 11-2 via the switch 12-3 and multiplexer 12-5 (not shown) and the other end connected to a node N4.

The NMOS transistor M9 has a gate electrode to which the signal SEN2 is input, and has a current path with one end connected to the ground potential VSS and the other end connected to the node N4.

Further, the NMOS transistor M10 has a gate electrode connected to the node N2, and a current path with one end connected to the node N4 and the other end connected to the node N2.

In addition, the PMOS transistor M11 has a gate electrode connected to the node N3, and a current path with one end connected to the node N2 and the other end to which the power supply voltage VDD is input.

The PMOS transistor M12 has a gate electrode to which the signal SEN1 is input, and has a current path with one end connected to the node N2 and the other end to which the power supply voltage VDD is input.

The PMOS transistor M13 has a gate electrode to which the signal RLENb is input, and has a current path with one end connected to the node N2.

The NMOS transistor M14 has a gate electrode to which the signal RLEN is input, and has a current path with one end connected to the node N2.

<Connection Example 2 of the Cell Array and Sense Amplifier According to the Embodiment>

Figure 6:
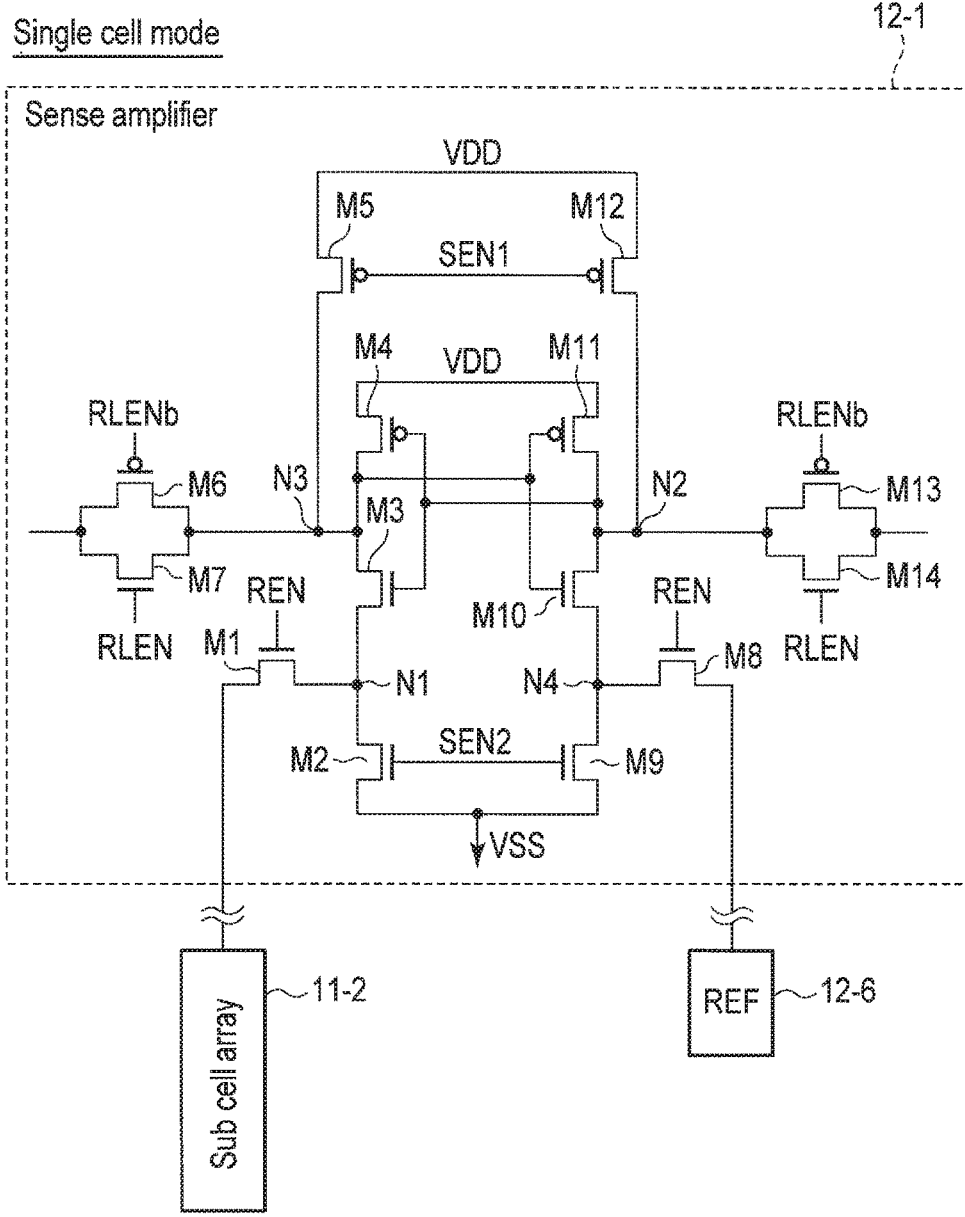
FIG. 6 shows a circuit illustrating a structure of the sense amplifier according to the embodiment.

Next, referring to FIG. 5 and FIG. 6, a description is given of a connection example of the cell array and sense amplifier in a case where the single cell mode, in which data sense is executed by using the reference circuit, is applied to the semiconductor storage device 1. Incidentally, since the basic structure of the sense amplifier 12-1 is the same as that described with reference to FIG. 4, only parts different from the parts shown in FIG. 4 are described.

As illustrated in FIG. 5, in the single cell mode, the signal REN is input to the gate electrode of the NMOS transistor M8, and one end of the current path thereof is connected to the reference circuit 12-6 via the switch 12-3 (not shown).

Besides, as illustrated in FIG. 6, in the single cell mode, the signal REN is input to the gate electrode of the NMOS transistor M1, one end of the current path thereof is connected to the sub-cell array 11-2 via the switch 12-2 and multiplexer 12-5 (not shown), and the other end of the current path is connected to the node N1.

As described above, in the twin cell mode, data for one sub cell array is stored by using two sub cell arrays (sub cell array 11-1 and sub cell array 11-2). However, in the single cell mode, each of the sub cell array 11-1 and sub cell array 11-2 can be used as a storage capacity.

<Comparison Between the Sense Speed of the Twin Cell Mode and the Sense Speed of the Single Cell Mode According to the Embodiment>

Figure 7:
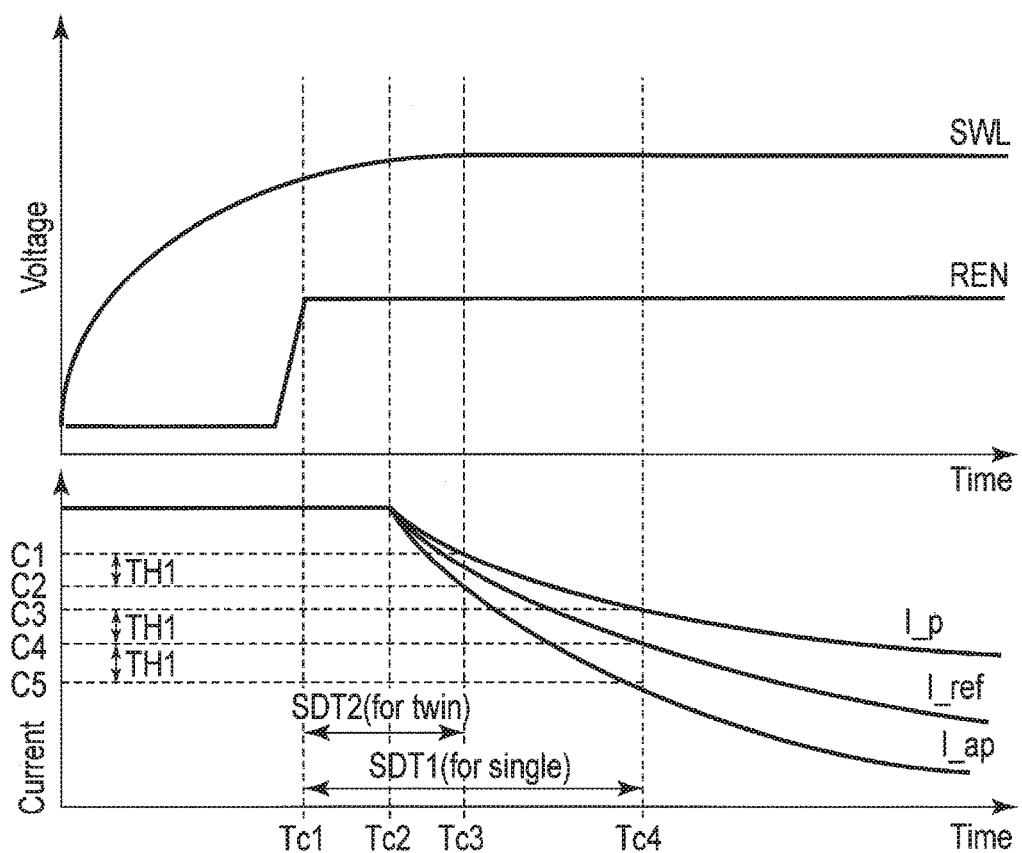
FIG. 7 is a graph illustrating a relationship between a cell current flowing in a memory cell and a reference current flowing in a reference circuit in the embodiment.

Next, referring to FIG. 7, a description is given of the sense speed of the twin cell mode and the sense speed of the single cell mode. Incidentally, a cell current I_p flows in a cell in a low resistance state (data "0") that is the parallel state (P state), and a cell current I_ap flows in a cell in a high resistance state (data "1") that is the antiparallel state (AP state). In addition, a reference current I_ref flows in the reference circuit.

To begin with, the sense at the time of the single cell mode is described. As illustrated in FIG. 7, the controller 15 supplies a select word line signal SWL to the row decoder 13. Then, at time instant Tc1, the timing controller 15a raises the signal REN from "L (Low)" level to "H (High)" level. At time instant Tc2, the current I_p, I_ap flowing in the memory cell MC and the reference current I_ref begin to vary. At time instant Tc4, a current difference (C3−C4) between the cell current I_p (C3) and reference current I_ref (C4) becomes a current difference TH1 which is sensible. Similarly, a current difference (C4−C5) between the cell current I_ap (C5) and reference current I_ref becomes a current difference TH1 which is sensible. In short, in the single cell mode, at time Tc4, the data of the memory cell MC becomes sensible.

Next, the sense at the time of the twin cell mode is described. As illustrated in FIG. 7, at time Tc3 (time instant Tc2<time instant Tc3<time instant Tc4), a current difference (C1−C2) between the cell current I_p (C1) and cell current I_ap (C2) becomes a current difference TH1 which is sensible. In short, in the twin cell mode, the sense of data of the memory cell MC becomes possible earlier than in the single cell mode.

Incidentally, in the present embodiment, a period from when the signal REN has risen from "L" level to "H" level to a time instant at which sense is enabled is referred to as "sense period SDT". In the single cell mode, a sense period SDT1 is time instant Tc4−time instant Tc1. In the twin cell mode, a sense period SDT2 is time instant Tc3−time instant Tc1 (SDT1>SDT2). In this manner, in the semiconductor storage device 1 according to the present embodiment, the sense period in the twin cell mode is shorter than the sense period in the single cell mode.

<Sense Operation of Semiconductor Storage Device 1 According to the Embodiment>

Next, referring to FIG. 8, the operation of the semiconductor storage device 1 according to the embodiment is described. In this embodiment, when the register 17 is receiving a twin/single selection signal from the outside, the register 17 supplies a sense period and a read latency to the timing controller 15a. Then, based on the twin/single selection signal received from the outside and the sense period and read latency received from the register 17, the timing controller 15a controls the signal REN, signal SEN1, signal SEN2 and signal RLEN which are supplied to the sense amplifier 12-1. The main sense amplifier 12 executes the sense operation in either the single cell mode or the twin cell mode, based on the twin/single selection signal received from the outside and the signal REN, signal SEN1, signal SEN2 and signal RLEN received from the timing controller 15a.

As illustrated in FIG. 8, based on the twin/single selection signal received from the outside and the sense period and read latency received from the register 17, the timing controller 15a controls the signal REN, signal SEN1, signal SEN2 and signal RLEN in the following manner.

[Time Instant T0] Twin Cell Mode/Single Cell Mode

At time instant T0, the address command circuit 16 issues a read command. At this time, the signal REN, signal SEN1, signal SEN2 and signal RLEN are at "L" level, and the signal RLENb is at "H" level.

[Time Instant T1] Twin Cell Mode/Single Cell Mode

At time instant T1, the timing controller 15a raises the signal REN from "L" level to "H" level. Thereby, the sense amplifier 12-1 starts sense of the sub cell array 11-1.

[Time Instant T2] Twin Cell Mode

In the case of the twin cell mode, at time instant T2 after the passing of a sense period SDT2 from time instant T1, the timing controller 15a raises the signal SEN1 from "L" level to "H" level. Thereby, the sense amplifier 12-1 completes the sense operation for the memory cell array 11. Incidentally, when the timing controller 15a determines the timing of raising the signal SEN1, the timing controller 15a uses the sense period SDT which has been supplied from the register 17.

[Time Instant T3] Twin Cell Mode

In the case of the twin cell mode, at time instant T3, the timing controller 15a raises the signal SEN2 from "L" level to "H" level. Incidentally, when the timing controller 15a determines the timing of raising the signal SEN2, the timing controller 15a uses the sense period SDT which has been supplied from the register 17.

[Time Instant T4] Twin Cell Mode

In the case of the twin cell mode, at time instant T4, the timing controller 15a raises the signal RLEN from "L" level to "H" level (lowers the signal RLENb from "H" level to "L" level). Thereby, the sense amplifier 12-1 transfers a sense result, which is held at the nodes N2 and N3, to the DQ circuit 14. Thereafter, at time instant T8, the sense amplifier 12-1 outputs the sense result to the outside via the DQ circuit 14. Incidentally, when the timing controller 15a determines the timing of raising the signal RLEN, the timing controller 15a uses the read latency RL which has been supplied from the register 17.

[Time Instant T5] Single Cell Mode

In the case of the single cell mode, at time instant T5 after the passing of a sense period SDT1 from time instant T1, the timing controller 15a raises the signal SEN1 from "L" level to "H" level. Thereby, the sense amplifier 12-1 completes the sense operation for the memory cell array 11.

[Time Instant T6] Single Cell Mode

In the case of the single cell mode, at time instant T6, the timing controller 15a raises the signal SEN2 from "L" level to "H" level.

[Time Instant T7] Single Cell Mode

In the case of the single cell mode, at time instant T7, the timing controller 15a raises the signal RLEN from "L" level to "H" level (lowers the signal RLENb from "H" level to "L" level). Thereby, the sense amplifier 12-1 transfers sense information, which is held at the nodes N2 and N3, to the DQ circuit 14. Thereafter, at time instant T9, the sense amplifier 12-1 outputs the sensed information to the outside via the DQ circuit 14.

[Time Instant T8] Twin Cell Mode

As described above, at time instant T8, the DQ circuit 14 outputs the information sensed by the sense amplifier 12-1 to the outside. Incidentally, time instant T0 to time instant T8 are a read time of the twin cell mode.

[Time Instant T9] Single Cell Mode

As described above, at time instant T9, the DQ circuit 14 outputs the information sensed by the sense amplifier 12-1 to the outside. Incidentally, time instant T0 to time instant T9 are a read time of the single cell mode.

In this manner, if the case of the twin cell mode and the case of the single cell mode are compared, the read can be completed earlier in the twin cell mode by a period ΔSDT (SDT1−SDT2).

<Advantageous Effects of the Semiconductor Storage Device 1 According to the Embodiment>

According to the above-described embodiment, the semiconductor storage device 1 can properly make use of the single cell mode and the twin cell mode, with use of the twin/single selection signal from the outside, by using the register 17, timing controller 15a and main sense amplifier 12.

As has been described above, in the single mode, the number of sub cell arrays, which are usable as storage areas, is larger than in the twin cell mode. However, in the twin cell mode, the read time is shorter than in the single cell mode.

Thus, when the use of a greater number of storage areas is desired, the single cell mode can be selected. When a shorter read time is desired, the twin cell mode can be selected. In this manner, when the semiconductor storage device 1 according to the embodiment is used, either the single cell mode or the twin cell mode can properly be switched by simply inputting the twin/single selection signal to the semiconductor storage device 1.

As has been described above, according to the present embodiment, there can be provided a semiconductor storage device with high quality, which can easily select a desirable mode, where necessary.

MODIFICATIONS, ETC

Incidentally, the above-described number of sub cell arrays, and the numbers of switches, multiplexers, etc. are merely examples, and the numbers are not limited to these examples.

In the above-described embodiment, when the operation mode of the semiconductor storage device 1 is switched from the single cell mode to the twin cell mode, the controller 15 initializes the semiconductor storage device 1. In addition, when the operation mode of the semiconductor storage device 1 is switched from the twin cell mode to the single cell mode, the controller 15 similarly initializes the semiconductor storage device 1.

In the above-described embodiments, the MRAM may be an STT-MRAM (spin-transfer torque magnetoresistive random access memory) utilizing a spin transfer phenomenon for magnetization reversal of a magnetic layer.

In this description, the MRAM that stores data using a magnetic tunnel junction (MTJ) element as the variable resistive element has been described by way of example. However, the embodiments are not limited to this example. For example, the embodiments are applicable to a semiconductor storage device that stores data utilizing a resistance change, for example, a resistance change type memory as well as the MRAM, such as a ReRAM (resistive random access memory) and a PCRAM (phase-change random access memory).

Furthermore, the embodiments are also applicable to a semiconductor storage device that stores data by a resistance change due to application of a current or a voltage, or reads the stored data by converting a difference in resistance due to a resistance change to a current difference or a voltage difference.

Besides, in the above-described embodiments, the bit line pair has been referred to as the bit line BL and source line SL, for convenience's sake. However, the embodiment is not limited to this example, and the bit line pair may be referred to, for example, as a first bit line and a second bit line.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor storage device comprising:
a first semiconductor storage area;
a second semiconductor storage area;
a reference circuit;
a sense amplifier which senses data stored in the first semiconductor storage area and the second semiconductor storage area;
a control circuit; and a storage module which stores first sense information relating to a first operation mode and second sense information relating to a second operation mode, and supplies the first sense information to the control circuit, when receiving a first operation mode selection signal which selects the first operation mode, or supplies the second sense information to the control circuit, when receiving a second operation mode selection signal which selects the second operation mode, wherein:

the data stored in the first semiconductor storage area or the second semiconductor storage area is sensed in the first operation mode by using the reference circuit, the data stored in the first semiconductor storage area is sensed in the second operation mode by using the second semiconductor storage area, the control circuit supplies a first control signal to the sense amplifier when the first operation mode selection signal and the first sense information are received, and supplies a second control signal to the sense amplifier when the second operation mode selection signal and the second sense information are received, the sense amplifier electrically connects the reference circuit and the first semiconductor storage area or the reference circuit and the second semiconductor storage area, when receiving the first operation mode selection signal and the first control signal, and to executes a sense operation of sensing the data stored in the first semiconductor storage area or the second semiconductor storage area by using the reference circuit, and the sense amplifier electrically connects the first semiconductor storage area and the second semiconductor storage area, when receiving the second operation mode selection signal and the second control signal, and executes a sense operation of sensing the data stored in the first semiconductor storage area by using the second semiconductor storage area.

2. The device of claim 1, wherein:

the first sense information includes a first sense period indicative of a period which is needed for a first sense operation in which the sense amplifier senses data in the first operation mode, and a first read period indicative of a period which is needed from a start of the first sense operation by the sense amplifier until read of the data, and the second sense information includes a second sense period indicative of a period which is needed for a second sense operation in which the sense amplifier senses data in the second operation mode, and a second read period indicative of a period which is needed from a start of the second sense operation by the sense amplifier until read of the data.

3. The device of claim 2, wherein:

the first control signal includes a first start signal for starting the first sense operation, a first termination signal for terminating the first sense operation, and a first output signal for causing the sense amplifier to output a result of the first sense operation, and the second control signal includes a second start signal, a second termination signal for terminating the second sense operation, and a second output signal for causing the sense amplifier to output a result of the second sense operation.

4. The device of claim 3, wherein the control circuit determines the first termination signal, based on the first operation mode selection signal and the first sense period, determines the first output signal, based on the first operation mode selection signal and the first read period, determines the second termination signal, based on the second operation mode selection signal and the second sense period, and determines the second output signal, based on the second operation mode selection signal and the second read period.

5. The device of claim 2, wherein the first sense period in the first operation mode is longer than the second sense period in the second operation mode.

6. The device of claim 2, wherein the first read period in the first operation mode is longer than the second read period in the second operation mode.

7. The device of claim 1, wherein the sense amplifier includes a switch circuit which electrically connects the reference circuit and the first semiconductor storage area or the second semiconductor storage area, when receiving the first operation mode selection signal, and which electrically connects the first semiconductor storage area and the second semiconductor storage area, when receiving the second operation mode selection signal.

8. The device of claim 1, wherein, at a time of the second operation mode, the first semiconductor storage area and the second semiconductor storage area store mutually complementary data.

9. The device of claim 1, wherein, in a case of selecting the first operation mode and then selecting the second operation mode, or in a case of selecting the second operation mode and then selecting the first operation mode, the control circuit initializes the first semiconductor storage area and the second semiconductor storage area.

10. The device of claim 1, wherein each of the first semiconductor storage area and the second semiconductor storage area includes a plurality of memory cells.

11. The device of claim 10, wherein the first semiconductor storage area and the second semiconductor storage area include the same number of said memory cells.

12. The device of claim 10, wherein the memory cell includes a magnetoresistive element.

13. The device of claim 10, wherein the memory cell is any one of an MRAM (Magnetic Random Access Memory), an FeRAM (Ferroelectric random access memory), a PCRAM (phase change random access memory), and a ReRAM (resistive random access memory).

14. A semiconductor storage device comprising:

a first semiconductor storage area which includes a memory cell including a magnetoresistive element;

a second semiconductor storage area which includes a memory cell including a magnetoresistive element;

a reference circuit;

a sense amplifier which senses data stored in the first semiconductor storage area and the second semiconductor storage area; and a control circuit, wherein:

a first sense period indicative of a period which is needed for a first sense operation in which the sense amplifier senses data, at a time of receiving a first operation mode selection signal which selects a first operation mode, is longer than a second sense period indicative of a period which is needed for a second sense operation in which the sense amplifier senses data, at a time of receiving a second operation mode selection signal which selects a second operation mode, the data stored in the first semiconductor storage area or the second semiconductor storage area is sensed in the first operation mode by using the reference circuit, and the data stored in the first semiconductor storage area is sensed in the second operation mode by using the second semiconductor storage area.

15. The device of claim 14, wherein:

the first operation mode selection signal includes a first start signal for starting the first sense operation, a first termination signal for terminating the first sense operation, and a first output signal for causing the sense amplifier to output a result of the first sense operation, and the second operation mode selection signal includes a second start signal, a second termination signal for terminating the second sense operation, and a second output signal for causing the sense amplifier to output a result of the second sense operation.

16. A semiconductor storage device comprising:

a first semiconductor storage area which includes a memory cell including a magnetoresistive element;

a second semiconductor storage area which includes a memory cell including a magnetoresistive element;

a reference circuit; and a sense amplifier which senses data stored in the first semiconductor storage area and the second semiconductor storage area;

wherein:

a first read period indicative of a period which is needed from a start of a first sense operation by the sense amplifier until read of the data, at a time of receiving a first operation mode selection signal which selects a first operation mode, is longer than a second read period indicative of a period which is needed from a start of a second sense operation by the sense amplifier until read of the data, at a time of receiving a second operation mode selection signal which selects a second operation mode, the data stored in the first semiconductor storage area or the second semiconductor storage area is sensed in the first operation mode by using the reference circuit, and the data stored in the first semiconductor storage area is sensed in the second operation mode by using the second semiconductor storage area.

17. The device of claim 16, wherein:

the first operation mode selection signal includes a first start signal for starting the first sense operation in the first operation mode, a first termination signal for terminating the first sense operation, and a first output signal for causing the sense amplifier to output a result of the first sense operation in the first operation mode, and the second operation mode selection signal includes a second start signal, a second termination signal for terminating the second sense operation, and a second output signal for causing the sense amplifier to output a result of the second sense operation.

* * * * *